United States Patent [19]
Mehta et al.

[11] Patent Number: 5,830,795
[45] Date of Patent: Nov. 3, 1998

[54] SIMPLIFIED MASKING PROCESS FOR PROGRAMMABLE LOGIC DEVICE MANUFACTURE

[75] Inventors: Sunil D. Mehta, San Jose; Radu Barsan, Cupertino, both of Calif.

[73] Assignee: Advanced Micro Devices, Inc., Sunnyvale, Calif.

[21] Appl. No.: 664,190

[22] Filed: Jun. 10, 1996

[51] Int. Cl.⁶ .............................................. H01L 21/8234
[52] U.S. Cl. ..................... 438/275; 438/257; 438/217; 438/263
[58] Field of Search .................... 438/275, 276, 438/279, 289, 291, 217, 257, 258, 263

[56] References Cited

U.S. PATENT DOCUMENTS

| | | | |
|---|---|---|---|
| 5,010,028 | 4/1991 | Gill et al. | 438/291 |
| 5,254,487 | 10/1993 | Tamagawa | 438/217 |
| 5,432,114 | 7/1995 | O | 438/275 |

OTHER PUBLICATIONS

"Inside AMD's CMOS PLD Technology," PLD Databook, AMD, 1993.

*Primary Examiner*—Tuan H. Nguyen
*Attorney, Agent, or Firm*—Fliesler, Dubb, Meyer & Lovejoy, LLP

[57] ABSTRACT

A process for forming CMOS transistors on a semiconductor substrate, wherein the plurality of transistors includes high-voltage N-channel and high-voltage P-channel transistors, and low-voltage N-channel and low-voltage P-channel transistors, wherein a tunnel oxide of a first thickness is required and a gate oxide of a second thickness is required is provided. The process comprises the steps of: forming a thick gate oxide on the surface of the substrate; forming a low voltage n-channel transistor mask, the mask including a plurality of windows exposing first portions of the thick gate oxide; implanting an n-type dopant into the substrate through said windows and through the thick gate oxide layer to form an n-dopant implant region; etching a first portion of the thick gate oxide exposing the surface of the substrate overlying the n-dopant implant region; stripping the low voltage n-channel mask; forming a low voltage p-channel transistor mask, the mask including a plurality of windows exposing the second portions of the thick gate oxide; implanting a p-type dopant into the substrate through said windows and through the thick gate oxide layer; etching a second portion of the thick gate oxide layer thereby exposing a first and second portions of the substrate surface; and simultaneously forming a tunnel oxide on the first exposed portion of the substrate and gate oxide on the second exposed portion of the substrate.

25 Claims, 5 Drawing Sheets

SIMPLIFIED MASKING PROCESS FOR PROGRAMMABLE LOGIC DEVICE MANUFACTURE

BACKGROUND OF THE INVENTION

1. Field of the Invention

The invention relates to methods of making programmable logic devices, and specifically electrically erasable programmable logic devices.

2. Description of the Related Art

Programmable logic devices (PLD) are circuits which can be configured by a user to perform logic functions. Generally, PLDs include a programmable array of cells and array control circuitry which is utilized to program the array with the desired implementation. The programmable array comprises a series of low-voltage, short channel floating gate transistors which store charge to reflect whether a particular cell is programmed with a bit of data. The programmed array reflects in a particular user's individual configuration for the programmable device, allowing users to customize the programmable logic device for a number of different applications.

One type of programmable logic device which has become popular due to its performance and cost characteristics are electrically erasable ($E^2$) CMOS programmable devices.

Erasable CMOS technology is based on the concept of a stored charge on a floating gate. Electrons are transferred to the gate through a physical mechanism known as Fowler-Nordheim tunneling. For an electrically erasable cell, a tunnel oxide is present between the source and drain regions and the floating gate that is about one-third of the thickness of a traditional transistor gate oxide. Fowler-Nordheim tunneling involves placing a potential across the tunnel oxide which distorts the electric field and allows electrons to traverse the tunnel oxide upon which they become trapped on a floating gate.

A schematic representation of an exemplary programming cell in a programmable logic device is shown in FIG. 1. FIG. 2 shows a semiconductor cross-section of the programming cell shown in FIG. 1. The control circuitry of the cell—the program transistors—essentially comprise high voltage transistors capable of sustaining high electric fields. As shown in FIG. 2, the read transistor, which operates at low voltage, includes a first junction 10, second junction 12 and control gate 14 (defined by the word line), which is separated from the first and second junctions by oxide layer 20. Oxide layer 20 has a thickness of approximately 180 Å. Program transistor 32 includes a first junction 16, second junction 18 and a gate $14_2$ which also rests on oxide layer 20. Floating gate 40 is separated from program junction 18 by tunnel oxide 22 which may be activated by control gate 24. The thickness of tunnel oxide 22 is in a range of approximately 80–100 Å.

When programming or erasing the device, a voltage is applied between the program and control gate nodes. The direction of the voltage determines whether the cell is erased or programmed. When erasing, the control gate is given a positive voltage and the program node is grounded. When programming, the program node voltage is elevated and the control gate is grounded.

Hence, in an $E^2$ CMOS PLD, four types of transistors are required: high voltage P channel, high voltage N channel, low voltage P channel, and low voltage N channel.

The trend of $E^2$ PLD devices has been toward lower and lower supply voltages. Consequently, this has required a corresponding scaling down of the gate oxide and two different oxide thicknesses for the gate and tunnel oxides. As the gate oxide thicknesses have been scaled down, they have begun to approach the thickness of the tunnel oxide on lightly or undoped silicon.

Traditionally, the manufacturing process for implementing all four types of cells requires a large number of sequential process steps. The reduction in processing steps, and specifically masking steps, is an objective of nearly every process engineer. Each savings of a masking step may result in a significant saving in the cost of manufacture of the particular device.

SUMMARY OF THE INVENTION

The invention, briefly described, comprises a process for forming a plurality of CMOS transistors on a semiconductor substrate, wherein the plurality of transistors includes high-voltage N-channel and high-voltage P-channel transistors, and low-voltage N-channel and low-voltage P-channel transistors, wherein a tunnel oxide of a first thickness is required and a gate oxide of a second thickness is required.

The process comprises the steps of: forming a thick gate oxide on the surface of the substrate; forming a first channel implant mask; implanting a dopant of a first type into the substrate to form a first channel implant region; etching the thick gate oxide to expose the surface of the substrate overlying the first implant region; removing the first transistor mask; forming a second transistor mask; implanting a second dopant into the substrate to form a second channel region; etching a portion of the thick gate oxide overlying the second dopant region; and simultaneously forming a tunnel oxide and a low voltage transistor gate oxide on the exposed portion of the substrate.

The process results in the saving of one masking step over the process disclosed in the prior art.

BRIEF DESCRIPTION OF THE DRAWINGS

The invention will be described with respect to the particular embodiments thereof. Other objects, features, and advantages of the invention will become apparent with reference to the specification and drawings in which.

DETAILED DESCRIPTION OF THE PREFERRED EMBODIMENTS

The invention provides a simpler and more cost-effective process of forming $E^2$ CMOS PLD devices, through the combination of two separate masking steps required by the process of the prior art, into a single masking step. This allows a savings of a single masking step over the process utilized in the prior art.

In the following description, numerous details, for example, specific materials, process steps, etc., are set forth in order to provide a thorough understanding of the present invention. It will be obvious, however, to one skilled in the art that the specific details need not be employed to practice the present invention. Moreover, specific details of particular processes or structures may not be specifically presented in order not to unduly obscure the invention where such details would be readily apparent to one of average skill in the art.

In particular, because the process of the present invention pertains to only a portion of the complete process required to form an $E^2$ PLD device, only that portion of the process critical to understanding the invention is described. The total amount of process steps required to form an $E^2$ PLD device is, as a whole, known to those of average skill. Hence, for clarity, only that portion of the process directly affected by the invention is illustrated here.

Figure 1:
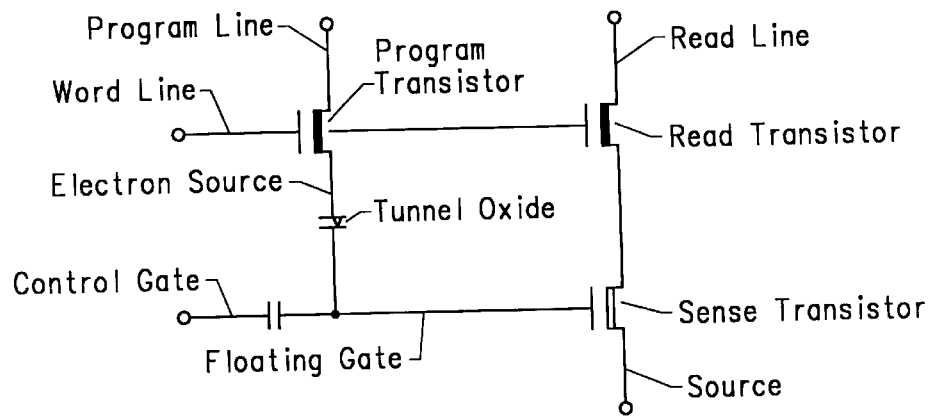
FIG. 1 is a schematic representation of a programming cell and $E^2$ PLD device.
Figure 2:
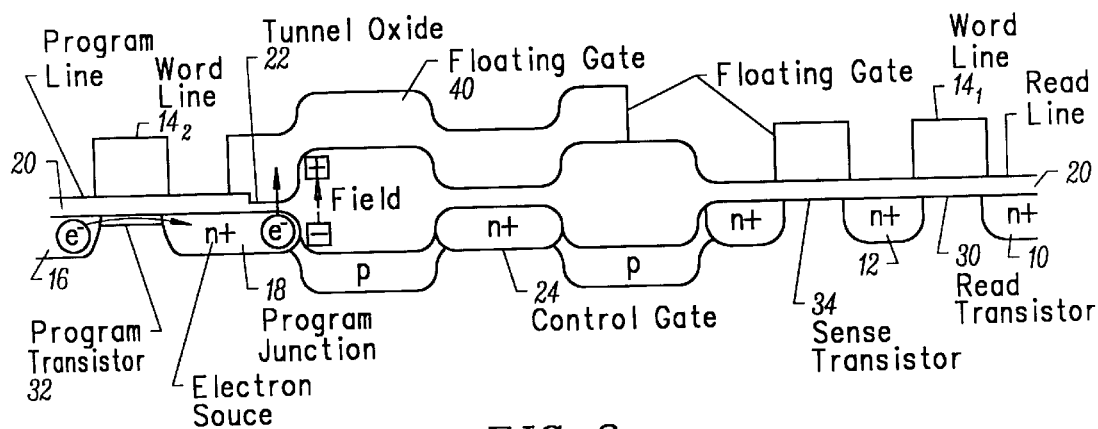
FIG. 2 is a semiconductor cross-section of the programming cell shown in FIG. 1.
Figure 3:
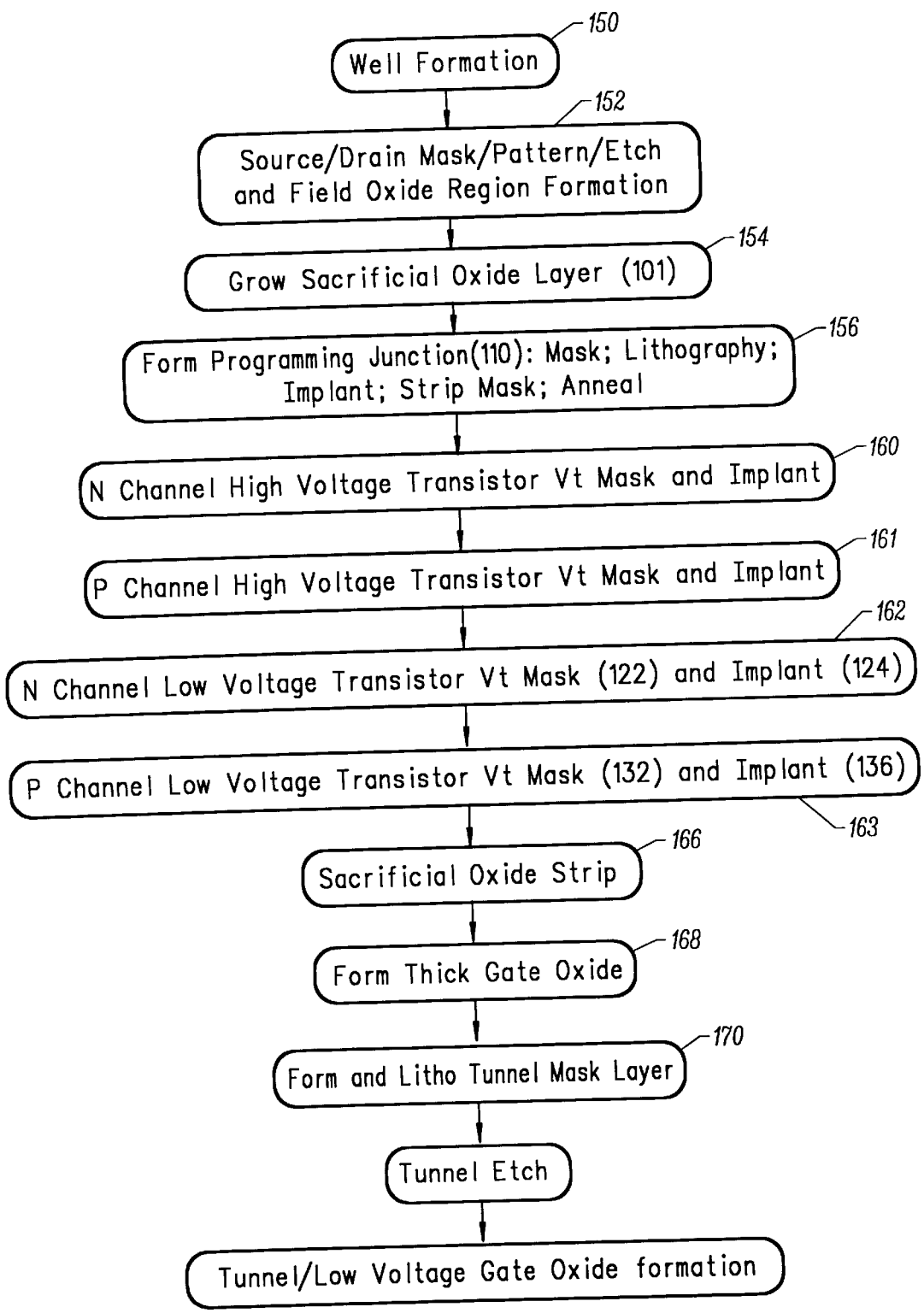
FIG. 3 is a flow chart representing a portion of the process of the prior art for forming a programming cell of an $E^2$ PLD device, specifically the portion of the process for performing transistor gate threshold voltage implants, forming the program junction, forming the gate oxide, and forming the tunnel oxide regions of a programming cell such as that shown in FIG. 2.
Figure 4:
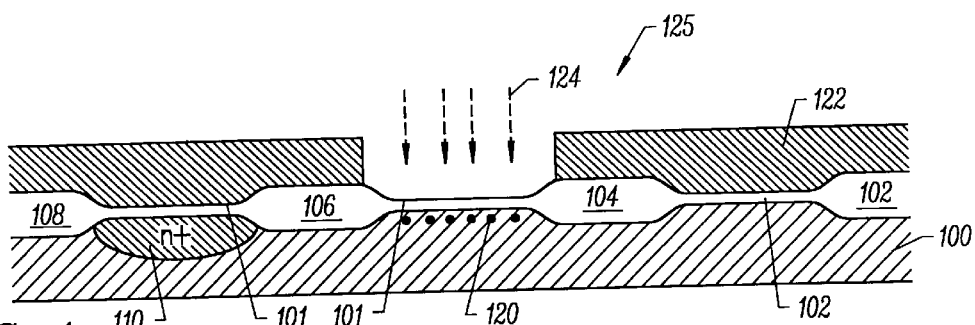
FIGS. 4–8 are cross-sections of a subconductor wafer illustrating a portion of the prior art process for forming the $E^2$ PLD cell shown in FIGS. 1–2, and specifically for performing the transistor gate threshold voltage implants, forming the gate oxide, forming the program junction, and forming the tunnel oxide regions of the programming cell.

A portion of the conventional process sequence utilized to form the threshold channel implant, gate oxide and tunnel oxide in a cell such as that shown in FIG. 2 is illustrated in FIG. 3. FIG. 4 shows a cross-section of semiconductor wafer 100 in which an $E^2$ programmable logic device utilizing CMOS technology is being formed. As will be recognized by one of average skill in the art, the process flow for preparing an $E^2$ PLD device includes a multitude of detailed processing steps. For example, the structure shown in FIG. 4, including wafer 100 upon which field oxide regions 102, 104, 106 and 108 have been grown, undergoes a number of pre-growth etching, cleaning and implant steps. It should be recognized by one of average skill in the art that to reach the particular structure shown in FIG. 4, a number of steps are required, as described below.

More specifically, cleaning steps, barrier oxidation steps, and zero level etching steps will have been performed on the substrate 100. In addition, as shown in FIG. 3, in the process of forming an $E^2$ PLD device, well implant regions may be provided (at step 150) in substrate 100 in accordance with known techniques. (For example, an implant of boron at $5.6 \times 10^{12}$ atom/cm.$^2$ at 60 KeV.) Subsequently, source/drain regions, isolated from each other by field oxide regions, will be formed (at step 152) by depositing, for example, a nitride layer of between 1,500 and 1,800 Å on the substrate, forming a source/drain mask over the nitride layer, and etching the nitride layer leaving portions of the layer covering the source/drain regions. It should be recognized that the wells may be formed subsequent to the source/drain pattern etch.

Subsequently, field oxide regions 102–108 are formed in substrate 100 by placing the substrate in an atmosphere of oxygen with 0.5% HCl at a temperature of about 1,100° to 1,150° Celsius to form oxide regions 102, 104, 106, 108 having a thickness of between 3,700 and 4,300 Å. As is well known, the nitride portions remaining on the substrate cover the source/drain regions and prevent field oxidation in these regions.

An etch back is subsequently performed on the field oxide layer and the nitride layer removed leaving source/drain substrate regions remaining between field oxide regions 102–108. A sacrificial oxide layer 101 is then grown at step 154 on the source/drain regions of silicon substrate 100 which remain between field oxide regions 102–108. Sacrificial oxide layer 101 is grown by placing substrate 100 (including field oxide regions 102–108) in an atmosphere of oxygen and hydrochloride (HCl) at a temperature of 900° C. for about one hour. Sacrificial oxide layer 101 has a thickness of between 200–300 Å.

After cleaning, program junction 110 is subsequently formed at step 156 in substrate 100 by depositing a program junction mask, patterning the mask using standard lithography techniques, and implanting junction 110 through the windows formed in the program junction mask by, for example, implanting phosphorous at a concentration of $1 \times 10^{15}$ atoms/cm.$^2$ at an energy of 60 KeV.

Following formation of program junction 110, field implant masking steps, and N-channel and P-channel field implants may be performed in accordance with well-known techniques. (These implant steps are not illustrated in FIG. 3.)

Following the provision of the field implants, high voltage transistor gate threshold voltage implants are performed at steps 161,162. These implants allow selection of the gate threshold voltage ($V_t$) for the high voltage transistors formed on substrate 100. The high voltage transistor channel region implants are performed in a manner similar to the following description of the low-voltage transistor channel implants. Hence, for purpose of clarity it is sufficient to note that the N-channel high voltage transistor channel implant step 160 and P-channel high voltage transistor $V_t$ mask and implant step 161 occur prior to the low-voltage transistor channel implants.

The structure shown in FIG. 4 results following performance of the high voltage transistor $V_t$ implant steps.

Specifically illustrated in FIG. 4 are the sub-steps of providing a low voltage N-channel transistor gate threshold voltage implant 120 using a channel transistor resist mask 122 and boron implant 124. This implant is used to select the gate threshold voltage ($V_t$) for the low voltage transistors having N-type channel regions. In accordance with well-known techniques, mask layer 122 is deposited on the surface of field oxide regions 102–108 and sacrificial oxide 101. Mask layer 122 is subsequently patterned using standard photolithography techniques to create a plurality of windows, such as opening 125 over the N-channels to be implanted.

As shown in FIG. 4, following lithography of the low voltage N-channel transistor gate threshold mask 122, a low voltage transistor, gate threshold voltage implant is performed by implanting an impurity such as boron in a concentration of $6.2 \times 10^{12}$ atoms/cm.$^2$ at an energy of about 20 KeV through sacrificial oxide layer 101 into the source/drain regions of substrate 100 exposed in window 125.

Following the low voltage N-channel transistor threshold voltage implant 124, a wet etch process is utilized to remove mask layer 122. An implant region 120 is shown as being present in substrate 100 subsequent to implant 124.

Figure 5:
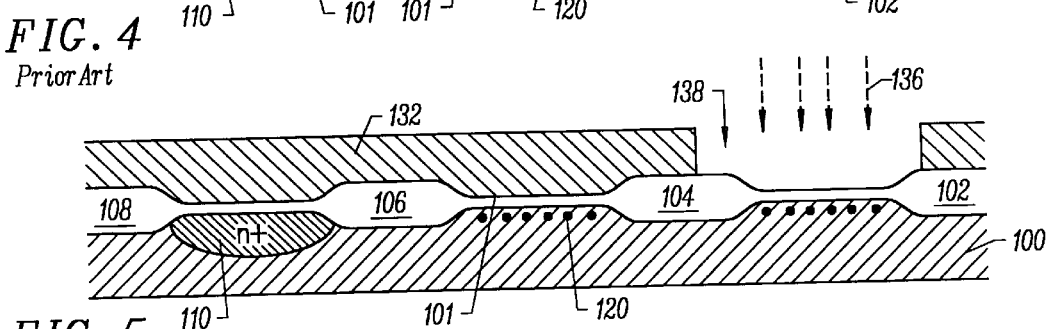

FIG. 5 shows sub-steps utilized to perform the low voltage P-channel transistor, gate threshold voltage implant. A low voltage P-channel transistor channel mask 132 is applied to the surface of field oxide regions 102–108 and sacrificial oxide 101. Mask layer 132 is patterned using conventional lithography techniques to provide a window 138 and an implant 136 of a P-type impurity such as phosphorous in a concentration of approximately $5.9 \times 10^{12}$ atoms/cm.$^2$ at an energy of 55 KeV is thereafter performed.

Subsequently, mask layer 132 is removed, and wafer 100 is prepared for tunnel oxide formation.

Figure 6:
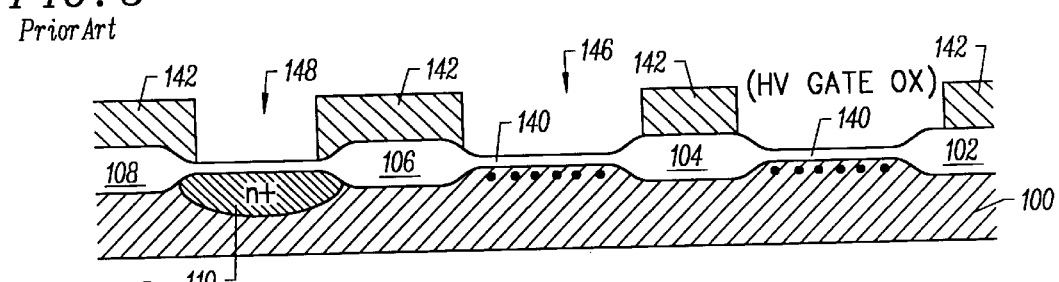
Figure 7:
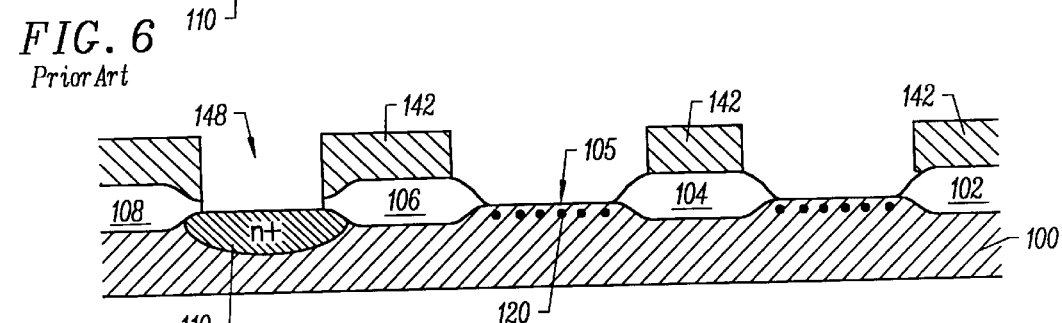

To form the tunnel oxide 150, sacrificial oxide layer 101 is stripped (at step 166, FIG. 3) and a thick gate oxide layer 140, shown in FIG. 6, is formed (at step 168) on the source/drain regions of substrate 100. Following formation of the thick gate oxide 140, a tunnel oxide mask 142 is formed on the surface of the field oxide regions 102–108 and the gate oxide 140. Mask layer 142 is patterned with conventional photolithography steps to provide windows 144, 146 and 148. As shown in FIG. 7, the thick gate oxide in regions 144, 146, 148 is then etched using a directional etch process, leaving the surface 105 of substrate 100 exposed in regions 144, 146 and 148.

Figure 8:
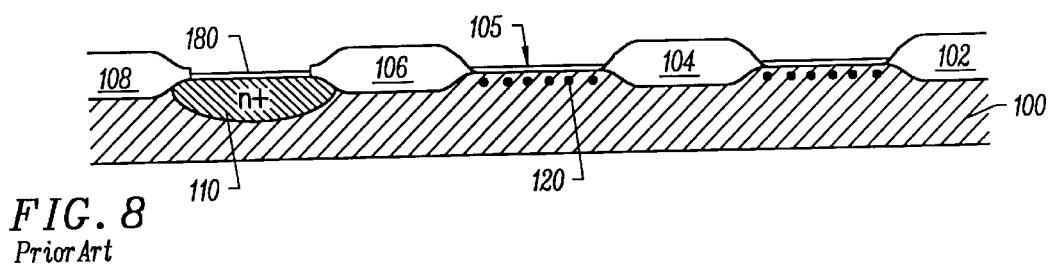

Next, photoresist 142 is thereafter removed as shown in FIG. 8. Finally, tunnel oxide 180 is formed on the surface of substrate 100 in window 148 by oxidizing the substrate in an atmosphere of oxygen and HCl during a ten-minute annealing process at a temperature of approximately 900° C. The structure is now ready for further processing to form specific elements of the E$^2$ PLD cells in accordance with well-known techniques. Such techniques can comprise, by way of example, standard CMOS transistor formation processes, including: polysilicon deposition, pattern and etching; poly re-oxidation; NLDD masking and implant steps, PLDD masking and implant steps, sidewall formation; n+ and p+ source/drain region formation and annealing; interconnect formation; and contact (metal) formation.

With reference to FIG. 3, it should be noted the N-channel high voltage transistor, gate threshold mask and implant step 160, P-channel high voltage transistor, gate threshold mask and implant step 161, N-channel low voltage transistor gate threshold mask and implant step 162, and P-channel low voltage transistor gate threshold mask and implant step 163 proceed in sequential order in FIG. 3. Sacrificial oxide is stripped at step 106 and thick gate oxide 168 formed following the gate threshold mask and implant steps.

Figure 9:
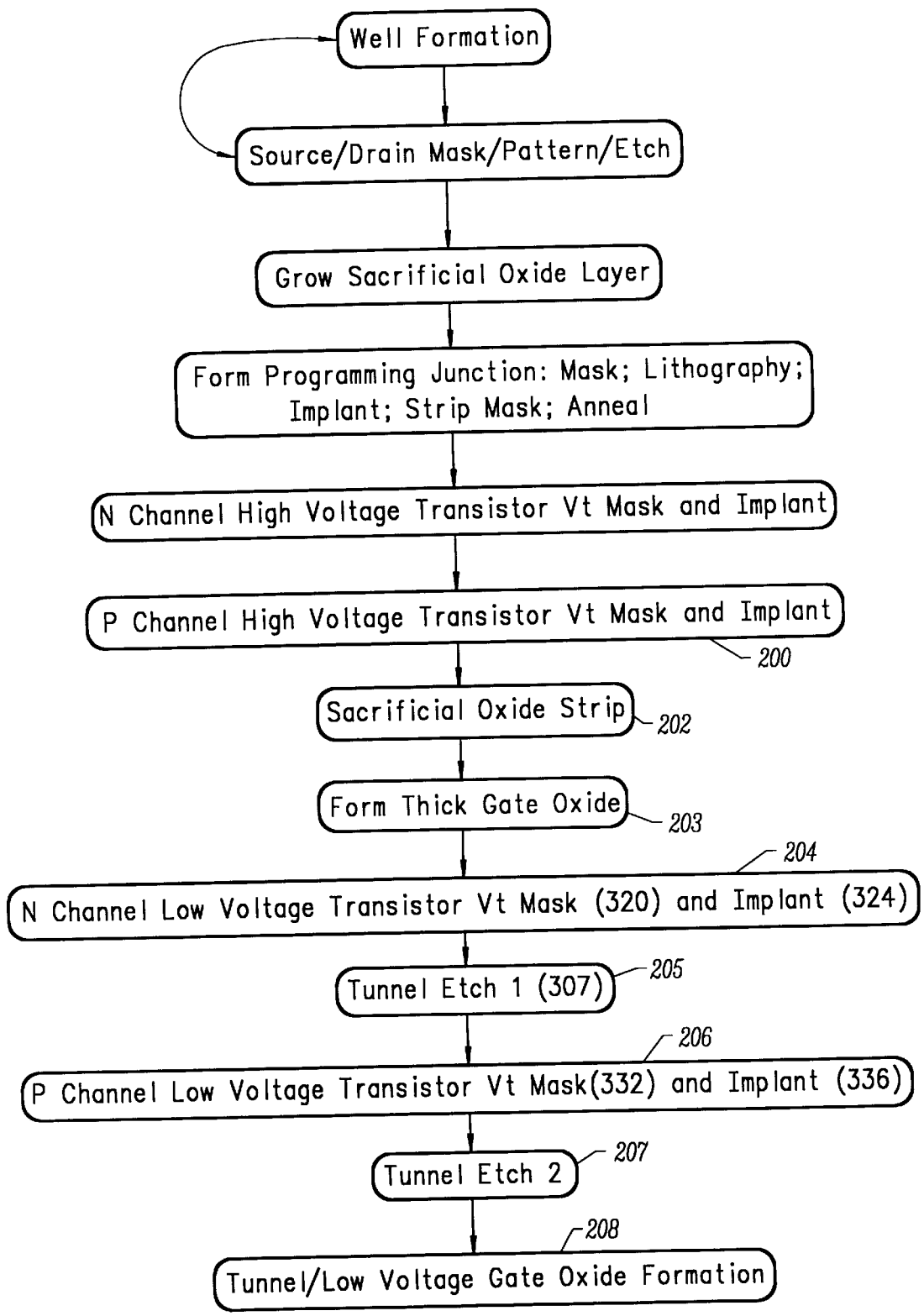
FIG. 9 is a flow chart representing the process of the present invention for performing transistor gate threshold voltage implants, forming the program junction, forming the gate oxide, and forming the tunnel oxide.

FIGS. 9–14 illustrate the processing sequence of the present invention. FIG. 9 shows the process sequence while FIGS. 10–14 are cross-sections of a semiconductor wafer illustrating the sequence of steps.

In the process of the present invention, the process proceeds in a manner equivalent to that shown in the prior art FIG. 3, except that, following formation of the P-channel high voltage transistor gate threshold mask and implant (reference numeral 200 in FIG. 9), sacrificial oxide is stripped at step 202, the thick gate oxide is then formed at step 203, and the N-channel low voltage transistor gate threshold mask and implant is performed at step 204. Subsequently, a tunnel etch is provided at step 205 and the P-channel low voltage transistor gate threshold mask and implant steps are performed at step 206. In contrast to the prior art, a second tunnel etch is then conducted and the P channel gate threshold mask formed at step 206 is utilized for the tunnel/low voltage gate oxide formation at step 208. This eliminates the need for a separate tunnel mask layer 170, shown in the process FIG. 3.

Figure 10:
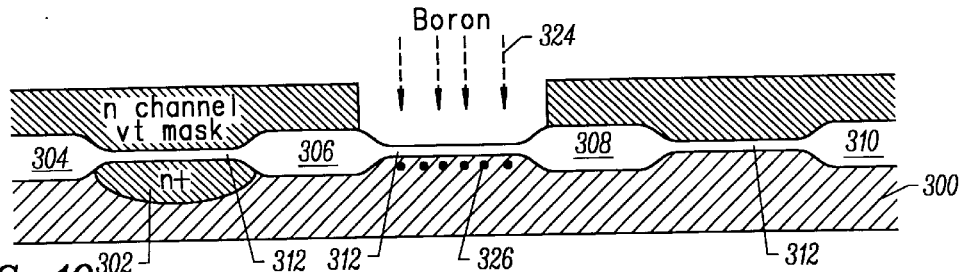
FIGS. 10–14 are cross-sections of a semiconductor wafer illustrating the process of the present invention for performing transistor gate threshold voltage implants, forming the program junction, forming the gate oxide regions and forming the tunnel oxide of a cell such as that shown in FIG. 2.
Figure 11:
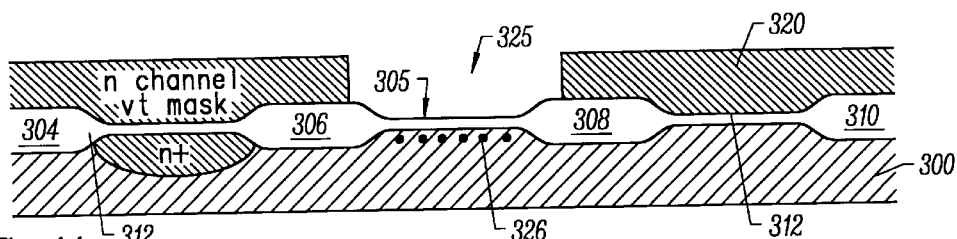
Figure 12:
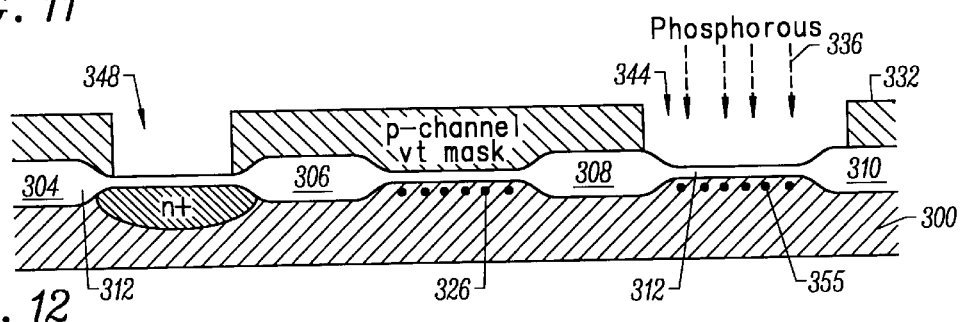
Figure 13:
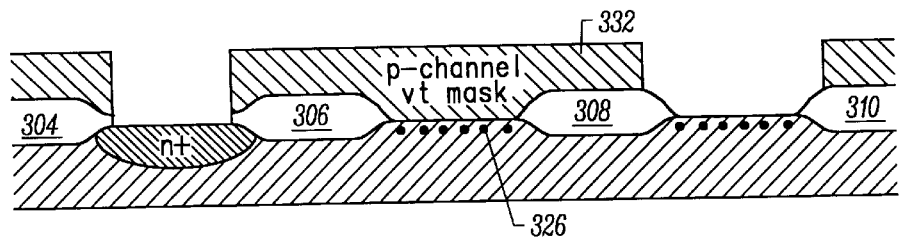

As shown in FIG. 9, the processes of the present invention proceeds in a manner similar to that of the process of the prior art shown in FIG. 3. In FIG. 10, substrate 300 has formed therein programming junction 302, field oxide regions 304, 306, 308 and 310, and a thick gate oxide layer 312, formed at step 203. It should be noted that the sacrificial oxide has been stripped (at step 202) prior to the view of the wafer shown in FIG. 10. Oxide layer 312 is equivalent to the thick oxide layer which is formed in step 203 in FIG. 9 and in step 140 in FIG. 6. It should be noted that the thick oxide layer in the method of the present invention is now formed prior to the low voltage transistor gate threshold implant masks and implant steps.

Mask layer 320 is formed in an equivalent manner to that of mask layer 122 in FIG. 3.

Mask layer 320 is patterned in accordance with standard photolithography techniques and an implant of boron 324 at a concentration of $6.2 \times 10^{12}$ atom/cm.$^2$ at 20 KeV is made in substrate 300 resulting in an implant region 326. Subsequently, as shown in step 205, a first etch process is used to remove the portion of the thick gate oxide overlying implant region 326 to expose the surface 305 of substrate 300.

Subsequently, at step 206, mask 320 is stripped and a P-channel, low voltage transistor gate threshold mask 332 is formed on the surface of the existing structure. Mask 332 is formed by a photolith process equivalent to that used in forming mask 132 in FIG. 4; the tunnel oxide window is also opened during this step. Mask 332 is subsequently patterned using well-known photolithography techniques to remove regions 344 and 348 exposing respective surfaces of thick gate oxide layer 312. The P-channel low voltage transistor gate threshold implant is therefore performed at step 206 in a manner equivalent to that of implant 136 in FIG. 4 forming region 355 in substrate 300.

Figure 14:
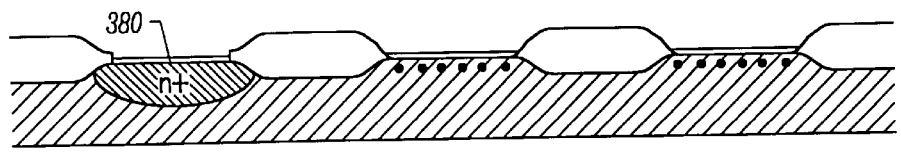

In accordance with the present invention, mask layer 332 is then subsequently used as a mask to etch, at step 207, portions of the thick gate oxide 312 in windows 344 and 348. As shown in FIG. 14, a tunnel and low voltage gate oxide 380 may thereafter be formed, at step 208, on the surface of substrate 300.

Thus, one mask step, the separate tunnel mask step 170, is eliminated. Although an additional etch step (207) is performed, because the mask steps are much more costly than the traditional etch steps, the process of the present invention results in a cost savings over that of the process of the prior art.

It should be understood that additional processing steps will be necessary to complete formation of the CMOS E$^2$ PLD device, such process steps being generally known to one of average skill in the art.

The many features and advantages of the present invention will be apparent to one of average skill in the art. All such features and advantages are intended to be within the scope of the invention as defined by the disclosure and as reflected in the following claims.

What is claimed is:

1. A process for forming threshold voltage channel implants in an E$^2$ PLD CMOS device having high voltage N-channel, high voltage P-channel, low voltage N-channel, and low voltage P-channel transistors, comprising the sequential steps of:

(a) forming a gate threshold voltage implant region of a high voltage transistor having a channel of a first conductivity type;

(b) forming a gate threshold voltage implant region of a high voltage transistor having a channel of a second conductivity type;

(c) forming a thick gate oxide;

(d) forming a gate threshold voltage implant region of a low voltage transistor of the first conductivity type;

(e) performing a first tunnel etch;
(f) forming a gate threshold implant region of a low voltage transistor of the second conductivity type;
(g) performing a second tunnel etch; and
(h) simultaneously forming a tunnel oxide and low voltage gate oxide.

2. The process of claim 1 wherein the first conductivity type is p-type.

3. The process of claim 1 wherein the first conductivity type is n-type.

4. A process for forming threshold voltage channel implants in an $E^2$ PLD CMOS device having high voltage N-channel, high voltage P-channel, low voltage N-channel, and low voltage P-channel transistors, comprising the sequential steps of:
(a) forming a high voltage N-channel transistor, gate threshold voltage implant region;
(b) forming a high voltage P-channel transistor, gate threshold voltage implant region;
(c) forming a thick gate oxide;
(d) forming a low voltage N-channel transistor gate threshold voltage implant region;
(e) performing a first tunnel etch;
(f) forming a P-channel low voltage transistor threshold implant region;
(g) performing a second tunnel etch; and
(h) simultaneously forming a tunnel oxide and low voltage gate oxide.

5. The process of claim 4 wherein said step (a) comprises:
(1) forming a sacrificial oxide on the surface of the substrate;
(2) forming a high voltage n-channel transistor mask layer, the layer including a plurality of window regions exposing a first plurality of portions of the sacrificial oxide;
(3) implanting an n-type dopant into the substrate through said plurality of window regions; and
(4) removing the high voltage n-channel transistor mask layer.

6. The process of claim 4 wherein said step (b) comprises:
(1) forming a high voltage p-channel transistor mask layer, the p-channel mask layer including a plurality of window regions exposing a second plurality of portions of the sacrificial oxide;
(2) implanting a p-type dopant into the substrate through said plurality of window regions; and
(3) removing the high voltage p-channel mask layer.

7. The process of claim 4 wherein the process further includes:
a step, prior to said step (a), of forming a sacrificial oxide layer; and
a step, prior to said step (c), of removing the sacrificial oxide layer.

8. The process of claim 4, wherein said step (d) includes the substeps of:
(1) forming a low voltage n-channel transistor mask, the mask including a plurality of windows exposing portions of the thick gate oxide; and
(2) implanting an n-type dopant into the substrate through said windows and through the thick gate oxide layer to form an n-dopant implant region.

9. The process of claim 8 wherein said step (e) comprises:
etching a portion of the thick gate oxide exposing the surface of the substrate overlying the n-dopant implant region.

10. The process of claim 9, further including the substep of:
(1) stripping the low voltage n-channel mask layer.

11. The process of claim 4 wherein said step (f) comprises:
(1) forming a low voltage p-channel transistor mask, the mask including a plurality of windows exposing portions of the thick gate oxide; and
(2) implanting a p-type dopant into the substrate through said windows and through the thick gate oxide layer.

12. The process of claim 4 wherein said step (g) comprises etching a portion of the thick gate oxide layer thereby exposing a portion of the substrate surface.

13. The process of claim 4 wherein said step (h) comprises heating the substrate to simultaneously form a tunnel oxide and low voltage gate oxide on the exposed portion of the substrate.

14. A process for forming a programmable logic device, comprising the sequential steps of:
(a) forming a thick gate oxide on the surface of the substrate;
(b) forming a low voltage n-channel transistor mask, the mask including a plurality of windows exposing first portions of the thick gate oxide;
(c) implanting an n-type dopant into the substrate through said windows and through the thick gate oxide layer to form an n-dopant implant region;
(d) etching a first portion of the thick gate oxide exposing the surface of the substrate overlying the n-dopant implant region;
(e) stripping the low voltage n-channel mask;
(f) forming a low voltage p-channel transistor mask, the mask including a plurality of windows exposing the second portions of the thick gate oxide;
(g) implanting a p-type dopant into the substrate through said windows and through the thick gate oxide layer;
(h) etching a second portion of the thick gate oxide layer thereby exposing a first and second portions of the substrate surface; and
(i) simultaneously forming a tunnel oxide on the first exposed portion of the substrate and gate oxide on the second exposed portion.

15. The process of claim 14 wherein the first exposed region comprises a program junction.

16. A process for forming a plurality of CMOS transistors on a semiconductor substrate, the plurality of CMOS transistors including high voltage N-channel, high voltage p-channel, low voltage n-channel and low voltage p-channel transistors, the method comprising the sequential steps of:
(a) forming a sacrificial oxide on the surface of the substrate;
(b) forming a high voltage n-channel transistor mask layer, the layer including a plurality of window regions exposing a first plurality of portions of the sacrificial oxide;
(c) implanting an n-type dopant into the substrate through said plurality of window regions;
(d) removing the high voltage n-channel transistor mask layer;
(e) forming a high voltage p-channel transistor mask layer, the p-channel mask layer including a plurality of window regions exposing a second plurality of portions of the sacrificial oxide;
(f) implanting an p-type dopant into the substrate through said plurality of window regions;

(g) removing the high voltage p-channel mask layer (h) removing the sacrificial oxide layer;

(i) forming a thick gate oxide on the surface of the substrate;

(j) forming a low voltage n-channel transistor mask, the mask including a plurality of windows exposing portions of the thick gate oxide;

(k) implanting an n-type dopant into the substrate through said windows and through the thick gate oxide layer to form an n-dopant implant region;

(l) etching a portion of the thick gate oxide exposing the surface of the substrate overlying the n-dopant implant region;

(m) stripping the low voltage n-channel mask layer;

(n) forming a low voltage p-channel transistor mask, the mask including a plurality of windows exposing portions of the thick gate oxide;

(o) implanting an p-type dopant into the substrate through said windows and through the thick gate oxide layer;

(p) etching a portion of the p-channel transistor mask and the thick gate oxide layer thereby exposing a portion of the substrate surface and tunnel window; and (q) simultaneously forming a tunnel oxide and a gate oxide on the exposed portion of the substrate.

17. The process of claim 16 wherein said step (b) comprises:

depositing a mask layer on the surface of the substrate;

selectively exposing portions of the mask layer to radiation; and developing the mask layer to remove said exposed or unexposed portions of the mask layer.

18. The method of claim 16 wherein said step (c) comprises implanting Boron at an energy of 20 KeV at a concentration of $1.9 \times 10^{12}$ atoms/cm.$^2$.

19. The process of claim 16 wherein said step (f) comprises implanting phosphorous at an energy of 55 KeV at a concentration of $4.0 \times 10^{11}$ atoms/cm.$^2$.

20. The process of claim 16 wherein said step (k) comprises implanting boron at an energy of 20 KeV at a concentration of $6.2 \times 10^{12}$ atoms/cm.$^2$.

21. The process of claim 16 wherein said step (o) comprises implanting phosphorous at an energy of 55 KeV and a concentration of $5.9 \times 10^{12}$ atoms/cm.$^2$.

22. The process of claim 16 wherein said step (i) comprises forming an oxide having a thickness between 110 and 140 Å.

23. The process of claim 16 wherein said step (q) comprises forming gate and tunnel oxide layers having a thickness between 70 and 90 Å.

24. A process for forming a programmable logic device, comprising the sequential steps of:

(a) forming a gate oxide on the surface of the substrate, the gate oxide having a first thickness;

(b) forming a first channel transistor mask, the mask including a plurality of windows exposing portions of the gate oxide;

(c) implanting a dopant of a first conductivity type into the substrate through said windows and said gate oxide to form a first dopant region;

(d) etching a portion of the gate oxide overlying the dopant region;

(e) removing the first channel transistor mask;

(f) forming a second transistor channel mask layer, the mask including a plurality of windows exposing second portions of the gate oxide;

(g) implanting a dopant of a second conductivity type into the substrate through said windows and said gate oxide layer;

(h) etching second portions of the gate oxide layer thereby exposing at least two portions of the substrate surface; and (i) simultaneously forming a tunnel oxide and a gate oxide on said at least two exposed portions of the substrate.

25. A process for forming active regions in a semiconductor substrate for a plurality of transistors formed in and on the semiconductor substrate, the substrate having a surface, comprising the sequential steps of:

(a) forming a first oxide layer on the surface of the substrate, the first oxide layer having a first thickness;

(b) forming program junctions in the substrate;

(c) forming a first implant mask layer;

(d) patterning the first implant mask layer;

(e) implanting a first implant dopant species in the substrate;

(f) removing the first implant mask layer;

(g) forming a second implant mask layer;

(h) patterning the second implant mask layer;

(i) implanting a second implant dopant species in the substrate;

(j) removing the second implant mask layer;

(k) removing the first oxide layer;

(l) forming a second oxide layer on the surface of the substrate, the second oxide layer having a second thickness;

(m) forming a third mask layer on the surface of the substrate;

(n) patterning the third implant mask layer;

(o) implanting the third implant dopant species in a higher concentration into the substrate;

(p) etching portions of the oxide layer overlying the first implant dopant species in the substrate;

(q) removing the third implant mask layer;

(r) forming a fourth mask layer on the surface of the substrate;

(s) patterning the fourth implant mask layer;

(t) implanting the second implant dopant species in a higher concentration into the substrate;

(u) etching portions of the second oxide layer overlying the second implant dopant species in the substrate and over a program junction portion of the substrate; and (v) forming a third oxide layer comprising a program junction oxide and gate oxide in said removed portions of the second oxide layer.

* * * * *